United States Patent
Iizuka et al.

(10) Patent No.: US 11,327,002 B2
(45) Date of Patent: May 10, 2022

(54) IN-LIQUID MICROPARTICLE ANALYSIS SYSTEM AND IN-LIQUID MICROPARTICLE ANALYSIS METHOD

(71) Applicants: SHARP KABUSHIKI KAISHA, Sakai (JP); THE UNIVERSITY OF TOKYO, Tokyo (JP)

(72) Inventors: Kunihiko Iizuka, Sakai (JP); Yoshihisa Fujimoto, Sakai (JP); Takeshi Mitsunaka, Sakai (JP); Teruo Fujii, Tokyo (JP); Soo-Hyeon Kim, Tokyo (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 55 days.

(21) Appl. No.: 16/632,833

(22) PCT Filed: Jun. 5, 2018

(86) PCT No.: PCT/JP2018/021519
§ 371 (c)(1),
(2) Date: Jan. 21, 2020

(87) PCT Pub. No.: WO2019/026413
PCT Pub. Date: Feb. 7, 2019

(65) Prior Publication Data
US 2020/0158620 A1  May 21, 2020

(30) Foreign Application Priority Data

Aug. 1, 2017  (JP) .............................. JP2017-149018

(51) Int. Cl.
*G01N 15/14* (2006.01)
*H01L 27/144* (2006.01)
(Continued)

(52) U.S. Cl.
CPC ......... *G01N 15/14* (2013.01); *G01N 15/1484* (2013.01); *H01L 27/1443* (2013.01); *H01L 31/02019* (2013.01); *H01L 31/02322* (2013.01)

(58) Field of Classification Search
CPC ............... G01N 15/14; G01N 15/1484; G01N 2015/1006; G01N 15/1434;
(Continued)

(56) References Cited

U.S. PATENT DOCUMENTS 5,405,519 A   4/1995  Schwartz
5,599,664 A   2/1997  Schwartz
(Continued)

FOREIGN PATENT DOCUMENTS

JP   H11-503022 A   3/1999
JP   H11-132953 A   5/1999
(Continued)

OTHER PUBLICATIONS

J. R. Webster et al., "Monolithic Capillary Electrophoresis Device with Integrated Fluorescence Detector", Analytical Chemistry, vol. 73, No. 7, Apr. 1, 2001, pp. 1622-1626.

*Primary Examiner* — David P Porta
*Assistant Examiner* — Mamadou Faye
(74) *Attorney, Agent, or Firm* — ScienBiziP, P.C.

(57) ABSTRACT

A size reduction in an optical system that detects a fluorescent photon is achieved. A photon detection operation of a photon detection unit (21) is controlled on the basis of timing of an irradiation operation of an excitation light source (50), and after excitation light emitted to a microfluidic channel (10) is switched off, a fluorescent photon generated by a target flowing in the microfluidic channel (10) is detected.

6 Claims, 14 Drawing Sheets

(51) Int. Cl.
*H01L 31/02* (2006.01)
*H01L 31/0232* (2014.01)

(58) Field of Classification Search
CPC ............... G01N 15/1459; G01N 21/64; H01L 27/1443; H01L 31/02019; H01L 31/02322
See application file for complete search history.

(56) References Cited

U.S. PATENT DOCUMENTS

| | | | |
|---|---|---|---|
| 5,720,928 | A | 2/1998 | Schwartz |
| 5,990,484 | A | 11/1999 | Ohsuka |
| 6,147,198 | A | 11/2000 | Schwartz |
| 6,150,089 | A | 11/2000 | Schwartz |
| 10,895,534 | B2 * | 1/2021 | Finkelstein ........... H01L 31/107 |
| 2004/0224317 | A1 | 11/2004 | Kordunsky et al. |
| 2005/0082204 | A1 | 4/2005 | Schwartz et al. |
| 2006/0088944 | A1 | 4/2006 | Schwartz et al. |
| 2007/0146704 | A1 | 6/2007 | Schmidt et al. |
| 2011/0294139 | A1 | 12/2011 | Takeda |
| 2012/0045786 | A1 * | 2/2012 | Stith ................. B01L 3/502738 435/29 |
| 2018/0166605 | A1 | 6/2018 | Nagai |

FOREIGN PATENT DOCUMENTS

| | | |
|---|---|---|
| JP | 2006-226969 A | 8/2006 |
| JP | 2007-071673 A | 3/2007 |
| JP | 2007-504477 A | 3/2007 |
| JP | 2007-171190 A | 7/2007 |
| JP | 2010-181349 A | 8/2010 |
| WO | 96/31522 A1 | 10/1996 |
| WO | 2016/170670 A1 | 10/2016 |

* cited by examiner

10: MICRO FLOW CHANNEL
11: INLET
12: OUTLET
21: PHOTON DETECTION UNIT
22: LIGHT DETECTING CIRCUIT
23: PHOTODIODE
30: CONTROL CIRCUIT
40: LIGHT SOURCE DRIVING CIRCUIT
50: EXCITATION LIGHT SOURCE
55: EXCITATION LIGHT PULSE
121: INTEGRATED CIRCUIT CHIP
FM: FLUORESCENT MOLECULE
X1, X2, X3: CELL

10: MICROFLUIDIC CHANNEL
11: INLET
12: OUTLET
21A, 21B, 21C: PHOTON DETECTION UNIT
22A, 22B, 22C: LIGHT DETECTING CIRCUIT
23A, 23B, 23C: PHOTODIODE
122: INTEGRATED CIRCUIT CHIP
FM: FLUORESCENT MOLECULE
X1, X2, X3: CELL

10: MICRO FLOW CHANNEL
11: INLET
12: OUTLET
21: PHOTON DETECTION UNIT
22: LIGHT DETECTING CIRCUIT
23: PHOTODIODE
30: CONTROL CIRCUIT
40: LIGHT SOURCE DRIVING CIRCUIT
50A, 50B: LASER LIGHT SOURCE
55A, 55B: EXCITATION LIGHT PULSE
121: INTEGRATED CIRCUIT CHIP
FM1, FM2: FLUORESCENT MOLECULE
X1, X2, X3: CELL

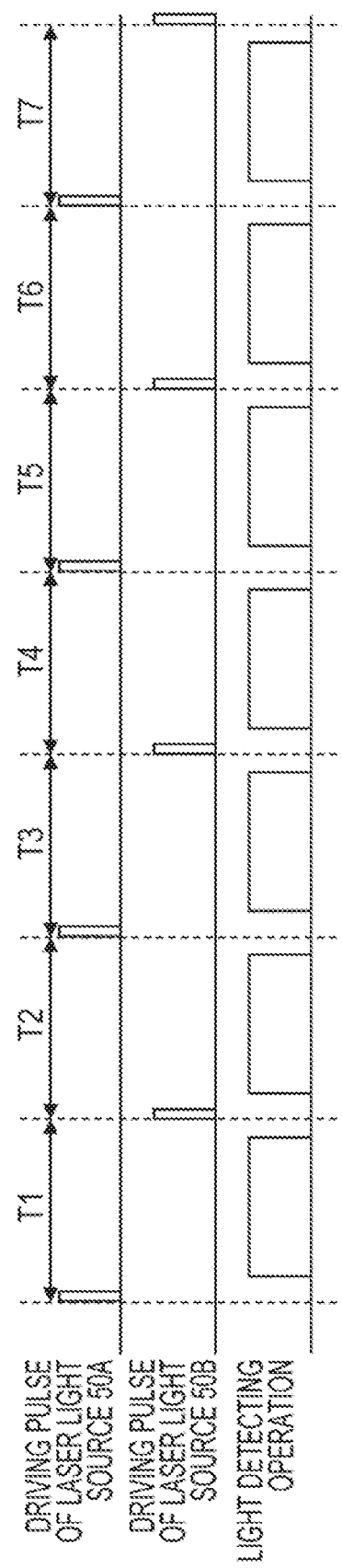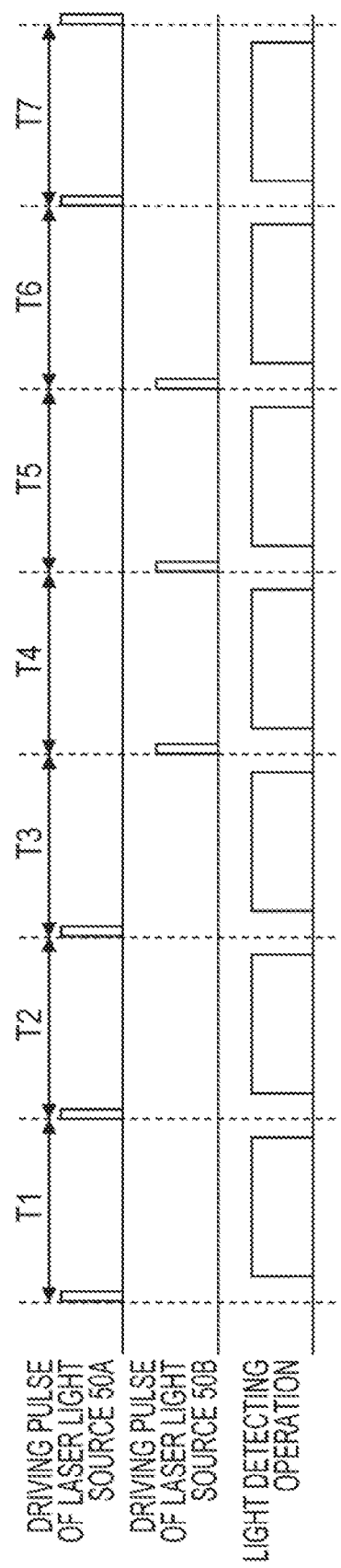

10: MICRO FLOW CHANNEL
11: INLET
12: OUTLET
21: PHOTON DETECTION UNIT
22: LIGHT DETECTING CIRCUIT
23: PHOTODIODE
61: TDC CIRCUIT
62: FLUORESCENT LIFETIME CALCULATION UNIT
125: INTEGRATED CIRCUIT CHIP
FM: FLUORESCENT MOLECULE
X1, X2, X3: CELL

US 11,327,002 B2

IN-LIQUID MICROPARTICLE ANALYSIS SYSTEM AND IN-LIQUID MICROPARTICLE ANALYSIS METHOD

TECHNICAL FIELD

The present invention relates to an in-liquid microparticle analysis system and an in-liquid microparticle analysis method that are used to optically analyze microparticles in a liquid.

BACKGROUND ART

Flow cytometers for optically analyzing microparticles in a fluid by causing liquid containing minute biological or non-biological particles to flow in a flow channel are conventionally known. In flow cytometers, by irradiating fluid with excitation light from a laser light source and detecting light scattering and fluorescence generated by analysis-target microparticles through irradiation with the excitation light, the target microparticles are analyzed (for example, refer to PTL 1).

Meanwhile, in flow cytometers, by utilizing a difference between the wavelength of the excitation light emitted to the analysis target and the wavelength of the fluorescence generated by the analysis-target microparticles through irradiation with the excitation light, the excitation light and the fluorescence are separated by an optical filter to enable detection of only the fluorescence.

CITATION LIST

Patent Literature

PTL 1: Japanese Unexamined Patent Application Publication No. 2010-181349 (published on Aug. 19, 2010)

SUMMARY OF INVENTION

Technical Problem

However, a conventional technique by which excitation light and fluorescence are separated by an optical filter to enable detection by a photodetector to be performed has a problem that an optical system is large and complex.

An aspect of the invention is made in view of the conventional problem described above and aims to provide an in-liquid microparticle analysis system and an analysis method that enable a size reduction to be achieved in an optical system for detecting fluorescent photons.

Solution to Problem

In order to solve the aforementioned problem, an in-liquid microparticle analysis system according to an aspect of the invention includes: an integrated circuit chip in which a photon detection unit including a photodiode is incorporated; a microfluidic channel formed on a front surface side of the integrated circuit chip; an excitation light source that irradiates the microfluidic channel with excitation light; and a control circuit that synchronously controls a photon detection operation of the photon detection unit and an irradiation operation of the excitation light source, in which the control circuit controls the photon detection operation of the photon detection unit on the basis of timing of the irradiation operation of the excitation light source, and after the excitation light emitted to the microfluidic channel is switched off, a fluorescent photon generated by a target flowing in the microfluidic channel is detected.

In order to solve the aforementioned problem, an in-liquid microparticle analysis method according to an aspect of the invention is an in-liquid microparticle analysis method for analyzing a microparticle in liquid by using the in-liquid microparticle analysis system, in which irradiation with excitation light is performed, a photon detection operation of detecting a fluorescent photon generated after the excitation light is switched off is periodically repeated, and results of photon detection operations performed in a time required for a single target flowing in the microfluidic channel to pass through the photon detection unit are summed, and the fluorescent photon from the single target is detected.

Advantageous Effects of Invention

According to an aspect of the invention, an effect that enables a size reduction to be achieved in an optical system for detecting a fluorescent photon is exerted.

BRIEF DESCRIPTION OF DRAWINGS

FIGS. 13A and 13B are timing charts illustrating timing for controlling irradiation operations of the laser light source 50A and the laser light source 50B and the photon detection operation of the photon detection unit 21.

DESCRIPTION OF EMBODIMENTS

Embodiment 1

Embodiment 1 of the invention will be described in detail below.

[Configuration of in-Liquid Microparticle Analysis System 101]

Figure 1:
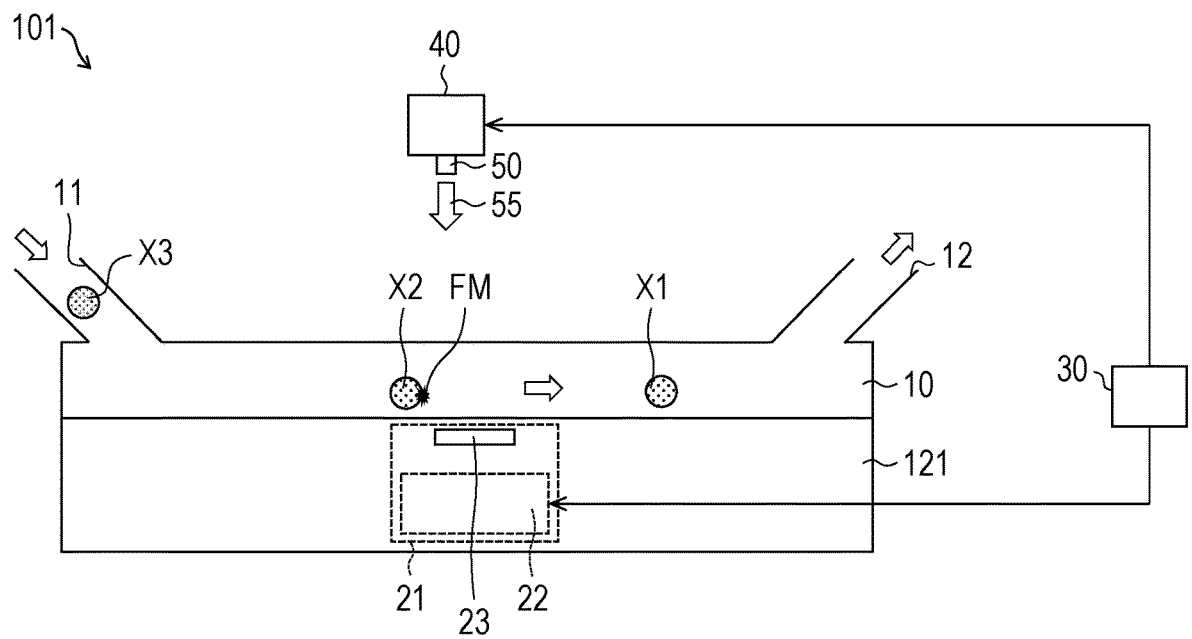
FIG. 1 is a schematic view illustrating a schematic configuration of an in-liquid microparticle analysis system 101 according to Embodiment 1 of the invention.
Figure 2:
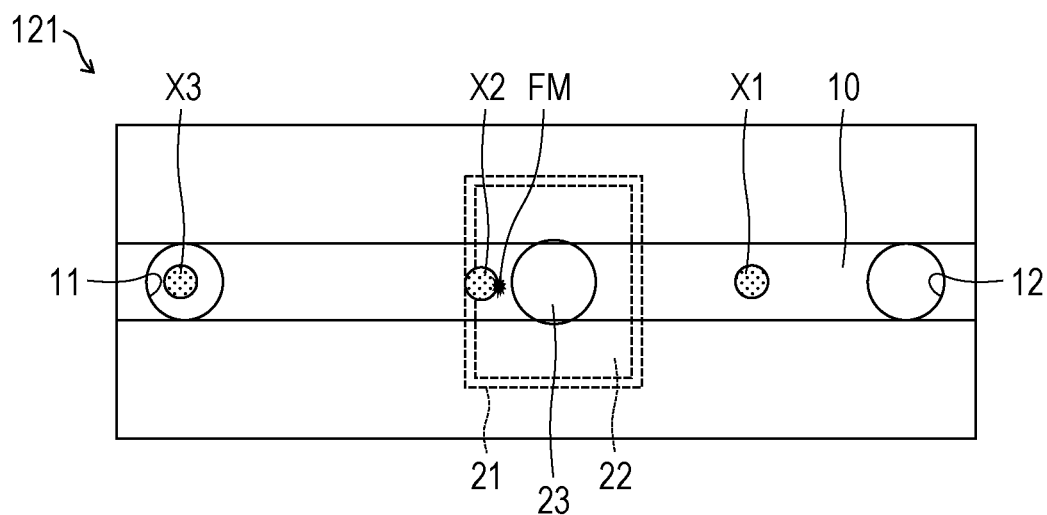
FIG. 2 is a schematic view illustrating a schematic configuration of an integrated circuit chip 121.

FIG. 1 is a schematic view illustrating a schematic configuration of an in-liquid microparticle analysis system 101 according to Embodiment 1 of the invention and is a view illustrating the in-liquid microparticle analysis system 101 from a side surface side. FIG. 2 is a view schematically illustrating a schematic configuration of an integrated circuit chip 121 and is a plan view of the integrated circuit chip 121 as viewed from a top surface side.

As illustrated in FIGS. 1 and 2, the in-liquid microparticle analysis system 101 includes a control circuit 30, the integrated circuit chip 121, and a light source driving circuit 40. The control circuit 30 is an arithmetic device having a function of integrally controlling respective units of the in-liquid microparticle analysis system 101. The control circuit 30 controls respective components of the in-liquid microparticle analysis system 101, for example, by using one or more processors (for example, CPUs) executing a program stored in one or more memories (for example, a RAM and a ROM).

The integrated circuit chip 121 includes a microfluidic channel 10 and a photon detection unit 21. The integrated circuit chip 121 may have a configuration in which the microfluidic channel 10 that is a fluid circuit part in which liquid flows and the photon detection unit 21 that is an electronic circuit part are incorporated in a semiconductor integrated circuit, such as a CMOS, which uses silicon. For example, the integrated circuit chip 121 is able to have a configuration in which the microfluidic channel 10 and the photon detection unit 21 are integrally formed by using a so-called MEMS technique.

Further, the integrated circuit chip 121 may have a configuration in which the microfluidic channel 10 and the photon detection unit 21 are overlapped to be integrated. For example, the integrated circuit chip 121 is able to have a configuration in which the microfluidic channel 10 that is a minute flow channel formed in a glass substrate and a light-transmissive member made of silicone resin or the like is placed on a silicon integrated circuit in which the photon detection unit 21 is incorporated.

The integrated circuit chip 121 includes the microfluidic channel 10 on a front surface side facing an excitation light source 50 described later and has the photon detection unit 21 provided in a lower layer with respect to the microfluidic channel 10. The microfluidic channel 10 is provided with an inlet 11 and an outlet 12. The microfluidic channel 10 is used as a flow channel of liquid that flows from the inlet 11 to the outlet 12 and contains microparticles.

The photon detection unit 21 has a photodiode 23 and a light detecting circuit 22. The photodiode 23 may be constituted by using, for example, a single photon avalanche diode (SPAD). The light detecting circuit 22 controls the photodiode 23 in accordance with a control signal supplied from the control circuit 30 and performs processing of an output signal of the photodiode 23.

The photon detection unit 21 performs a light detecting operation of amplifying, by using the light detecting circuit 22, an electric signal generated when a photon enters the photodiode 23 and generating a fluorescent photon detection pulse from the light detecting circuit 22. Further, the photon detection unit 21 has a function of counting the number of fluorescent photon detection pulses generated by the light detecting circuit 22. Note that, the photon detection unit 21 is an optical system in the in-liquid microparticle analysis system 101.

The light source driving circuit 40 controls light-emission driving of an excitation source of the excitation light source 50 in accordance with a control signal supplied from the control circuit 30 and performs an irradiation operation of irradiating an irradiation target with excitation light from the excitation light source 50. For the excitation light source 50, for example, a laser light source of a gas laser, a semiconductor laser, or the like is able to be used. Note that, FIG. 1 illustrates an example in which the control circuit 30 and the light source driving circuit 40 are separate from the integrated circuit chip 121, but the control circuit 30 and the light source driving circuit 40 may be configured to be formed in the integrated circuit chip 121.

In the in-liquid microparticle analysis system 101, liquid is caused to flow in the microfluidic channel 10 and, by the light source driving circuit 40, the excitation source of the excitation light source 50 is caused to perform pulse light emission to perform irradiation with the excitation light. In an irradiation range of the excitation light source 50, a fluorescent molecule FM in the liquid in the microfluidic channel 10 is excited upon irradiation with the excitation light from the excitation light source 50. The photon detection unit 21 performs a photon detection operation of detecting a fluorescent photon generated when the fluorescent molecule FM is excited.

Figure 3:
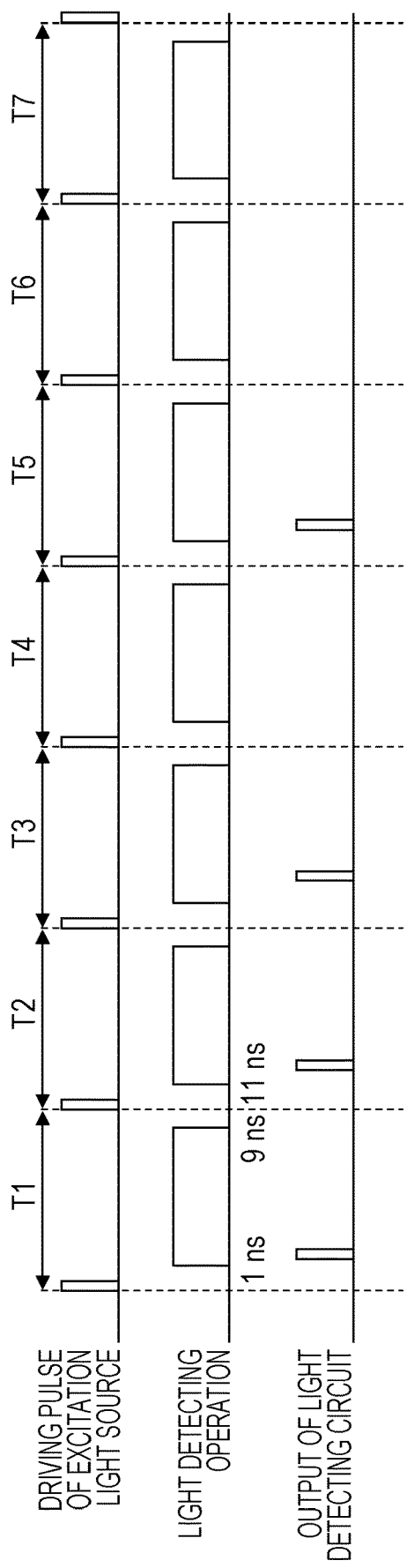
FIG. 3 is a timing chart illustrating timing for controlling an irradiation operation of an excitation light source 50 and a photon detection operation of a photon detection unit 21.

The irradiation operation of the excitation light source 50 by the light source driving circuit 40 and the photon detection operation of the photon detection unit 21 are synchronously controlled by the control circuit 30. FIG. 3 is a timing chart illustrating timing for controlling the irradiation operation of the excitation light source 50 and the photon detection operation of the photon detection unit 21 under control of the control circuit 30.

[In-liquid microparticle analysis method by in-liquid microparticle analysis system 101]

As illustrated in FIG. 3, by using a driving pulse signal according to control of the control circuit 30, the light source driving circuit 40 causes the excitation source of the excitation light source 50 to perform pulse light emission in which light is repeatedly emitted and switched off. The control circuit 30 stops the light detecting operation of the photon detection unit 21 during a period of the irradiation operation in which the light source driving circuit 40 outputs the driving pulse signal that causes the excitation source of the excitation light source 50 to emit light. In the irradiation range of the excitation light source 50, when the excitation light from the excitation light source 50 is emitted, the fluorescent molecule FM in the microfluidic channel 10 is excited and the fluorescent photon is generated.

When the driving pulse signal input from the light source driving circuit 40 to the excitation light source 50 falls, the excitation source of the excitation light source 50 switches off the light. Then, the control circuit 30 starts the light detecting operation of the photon detection unit 21.

When the fluorescent photon enters the photodiode 23 during a period of the light detecting operation of the photon detection unit 21, an electric signal is generated and amplified by the light detecting circuit 22 and a fluorescent photon detection pulse is generated. Note that, the fluorescent molecule FM excited by the excitation light from the excitation light source 50 generates a fluorescent photon while being attenuated, even after the excitation source of the excitation light source 50 switches off the light. Thereby, the photon detection unit 21 is able to detect the fluorescent photon during the period of the light detecting operation after the excitation source of the excitation light source 50 switches off the light. Note that, while the excitation light source 50 emits light, a photon of the excitation light from the excitation light source 50 enters the photodiode 23. In the present embodiment, however, since the light detecting operation of the photon detection unit 21 stops while the excitation source of the excitation light source 50 is emitting light, photon detection by the photon detection unit 21 is not affected by the light emission of the excitation source of the excitation light source 50.

In this manner, in one driving pulse cycle T, the control circuit 30 performs the irradiation operation by causing the excitation source of the excitation light source 50 to emit light by using the driving pulse signal and performs the photon detection operation by using the photon detection unit 21 after the excitation source switches off the light. Then, the control circuit 30 periodically repeats the driving pulse cycle T as driving pulse cycles T1, T2, T3, . . . . Specific timing of the irradiation operation of the excitation light source 50 and the photon detection operation performed by the photon detection unit 21 in the driving pulse cycle T is able to be set so that, for example, a driving pulse of the excitation light source 50 has a width of 500 ps and one driving pulse cycle is 10 nsec. The light detecting circuit 22 starts the light detecting operation 1 ns after the driving pulse of the excitation light source 50 rises, and ends the light detecting operation 9 nsec after the driving pulse of the excitation light source 50 rises.

Figure 4:
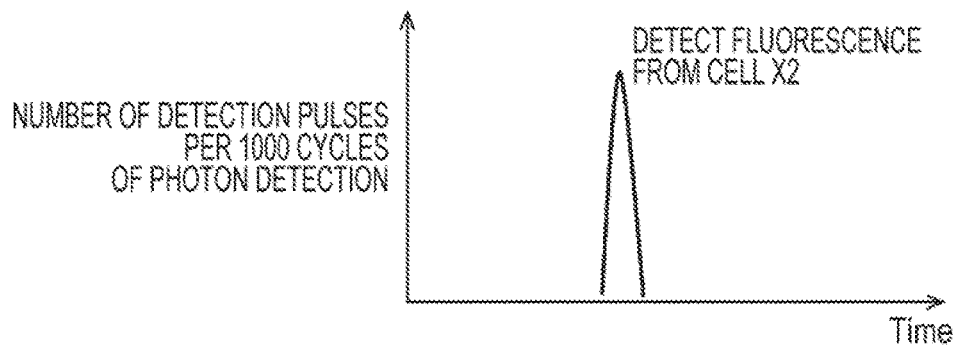
FIG. 4 is a graph with the horizontal axis indicating time in which the number of fluorescent photon detection pulses when a photon detection operation for 10 nsec is repeated 1000 times is plotted.

FIG. 4 is a graph with the horizontal axis indicating time in which the number of fluorescent photon detection pulses when the photon detection operation for 10 nsec is repeated 1000 times in a period required for a single target (for example, a cell X2) flowing in the microfluidic channel 10 to pass through the photon detection unit 21 is plotted. Repeating the photon detection operation of 10 nsec 1000 times takes 10 μsec, and accordingly the number of fluorescent photon detection pulses is plotted every 10 μsec.

For example, in a case where the fluorescent molecule FM is weak and the number of fluorescent photons generated when the fluorescent molecule FM is excited by the excitation light from the excitation light source 50 is small, the fluorescent photon detection pulse is not necessarily generated by the light detecting circuit 22 in one driving pulse cycle T. In the present embodiment, however, the driving pulse cycle T is periodically repeated in the time required for the single target flowing in the microfluidic channel 10 to pass through the photon detection unit 21, and the number of fluorescent photon detection pulses of the light detecting circuit 22, which are generated by the fluorescent photon entering the photodiode 23, is measured, thus making it possible to detect a photon even when the fluorescent molecule FM is weak.

[Additional Matter]

According to Embodiment 1, the in-liquid microparticle analysis system 101 includes the integrated circuit chip 121 in which the photon detection unit 21 including the photodiode 23 is incorporated, the microfluidic channel 10 provided on the front surface side of the integrated circuit chip 121, the excitation light source 50 that irradiates the microfluidic channel 10 with excitation light, and the control circuit 30 that synchronously controls the detection operation of the photon detection unit 21 and the irradiation operation of the excitation light source 50. The control circuit 30 controls the photon detection operation of the photon detection unit 21 on the basis of timing of the irradiation operation of the excitation light source 50. After the excitation light emitted to the microfluidic channel 10 is switched off, the photon detection unit 21 detects a fluorescent photon generated by a target flowing in the microfluidic channel 10.

According to such configurations, by controlling the detection operation of the photon detection unit 21 and the irradiation operation of the excitation light source 50, the fluorescent photon generated by the target flowing in the microfluidic channel 10 is detected after the excitation light emitted to the microfluidic channel 10 is switched off. As a result, the excitation light from the excitation light source 50 and the fluorescent photon generated by the fluorescent molecule FM excited by the excitation light do not need to be separated by an optical filter, thus making it possible to achieve a size reduction in the optical system.

Moreover, according to an in-liquid microparticle analysis method for analyzing a microparticle in liquid by using the in-liquid microparticle analysis system 101 of Embodiment 1, a photon detection operation of performing irradiation with excitation light to detect a fluorescent photon generated after the excitation light is switched off is periodically repeated, and results of photon detection operations performed in a time required for a single target flowing in the microfluidic channel 10 to pass through the photon detection unit 21 are summed, and thereby a fluorescent photon from the single target is detected.

According to such a configuration, even when the fluorescent molecule FM is weak, the photon is able to be detected.

Embodiment 2

Embodiment 2 of the invention will be described as follows with reference to FIGS. 5 to 7. Note that, for convenience of description, a member having the same function as that of the member described in Embodiment 1 described above will be given the same reference sign and description thereof will be omitted.

[Configuration of in-Liquid Microparticle Analysis System 102]

Figure 5:
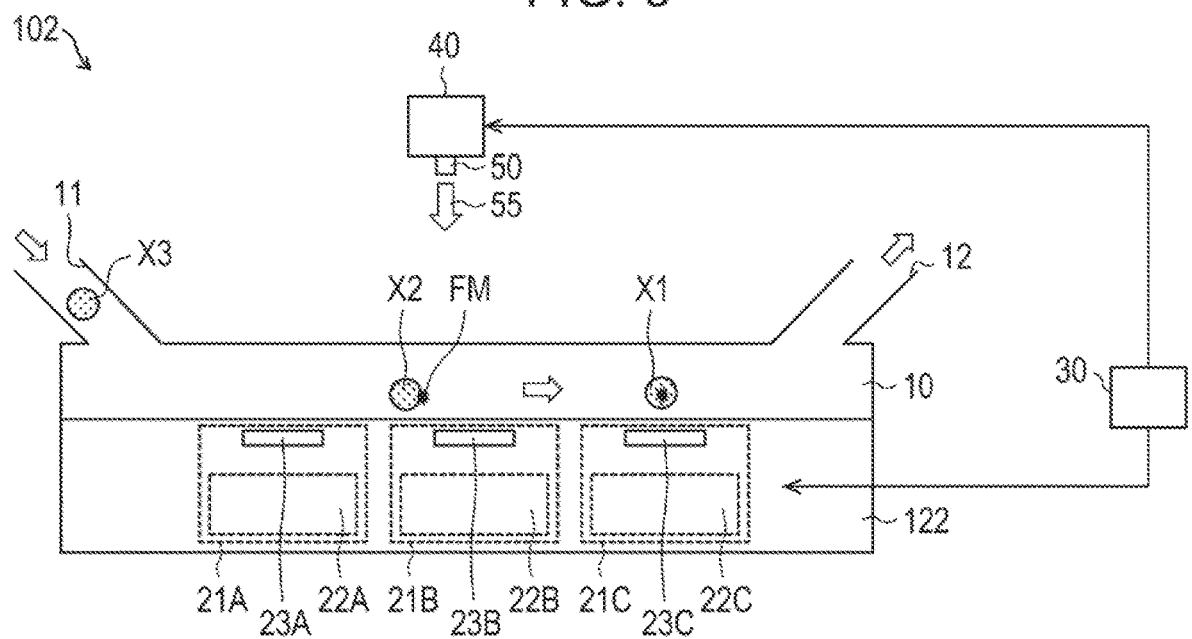
FIG. 5 is a schematic view illustrating a schematic configuration of an in-liquid microparticle analysis system 102 according to Embodiment 2.
Figure 6:
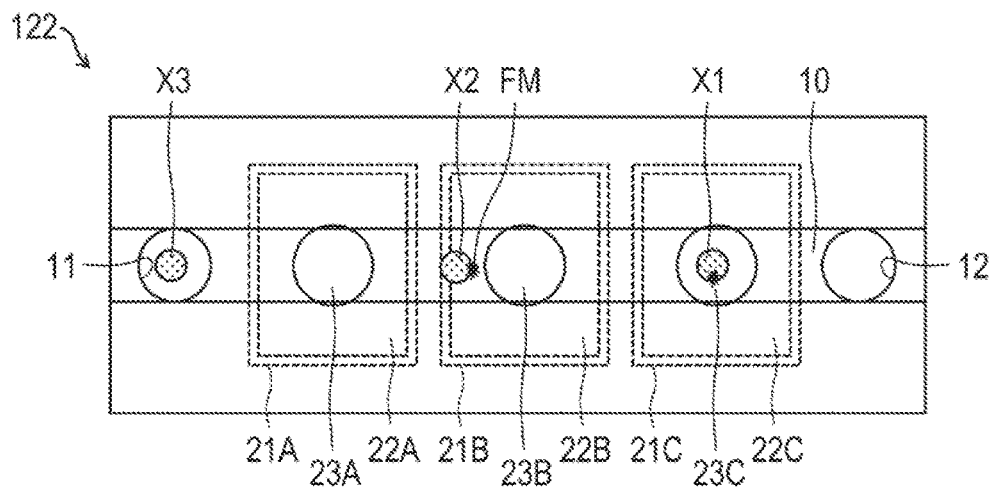
FIG. 6 is a schematic view illustrating a schematic configuration of an integrated circuit chip 122.

FIG. 5 is a schematic view illustrating a schematic configuration of an in-liquid microparticle analysis system 102 according to Embodiment 2 and is a view illustrating the in-liquid microparticle analysis system 102 from a side surface side. FIG. 6 is a plan view of an integrated circuit chip 122 as viewed from a top surface side.

In Embodiment 1 described above, the integrated circuit chip 121 includes one photon detection unit 21 below the microfluidic channel 10. Embodiment 1 and Embodiment 2 are different in that the integrated circuit chip 122 is provided with at least two photon detection units 21 along a flowing direction of the microfluidic channel 10 in Embodiment 2 as illustrated in FIGS. 5 and 6. FIGS. 5 and 6 each illustrate an example in which the integrated circuit chip 121 is provided with three photon detection units 21 (21A, 21B, and 21C) along the microfluidic channel 10, but the number of photon detection units 21 is only required to be at least two and not limited to three. Note that, an optical system of the in-liquid microparticle analysis system 102 is constituted by the photon detection units 21A, 21B, and 21C together.

Moreover, in the in-liquid microparticle analysis system 102, an irradiation range of an excitation light pulse 55 from the excitation light source 50 is adjusted so as to include light detecting parts of photodiodes 23A, 23B, and 23C of all the photon detection units 21A, 21B, and 21C. Microparticles in liquid flowing in the microfluidic channel 10 pass over the photodiode 23A, the photodiode 23B, and the photodiode 23C in order along a flow of the liquid. In a case where the liquid flowing in the microfluidic channel 10 contains microparticles such as cells X1 and X2 each having the fluorescent molecule FM, the fluorescent molecule FM is detected by the photon detection units 21A, 21B, and 21C in order when the microparticles pass over the photodiodes 23A, 23B, and 23C.

[In-Liquid Microparticle Analysis Method by in-Liquid Microparticle Analysis System 102]

Figure 7:
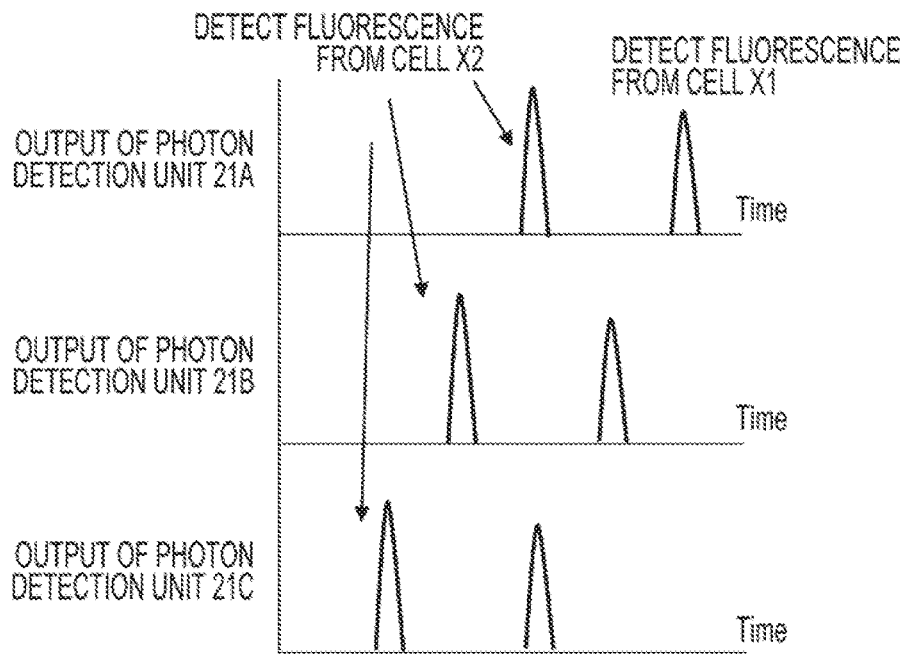
FIG. 7 illustrates graphs with the horizontal axis indicating time in which the numbers of fluorescent photon detection pulses output from photon detection units 21A, 21B, and 21C are plotted.

FIG. 7 illustrates an example of outputs assumed to be provided from the photon detection units 21A, 21B, and 21C when the two cells X1 and X2 each having the fluorescent molecule FM flow in the microfluidic channel 10. Similarly to FIG. 4 described above, FIG. 7 illustrates graphs with the horizontal axis indicating time in which the numbers of fluorescent photon detection pulses for each of 1000 photon detection operations are plotted.

For example, a fluorescent photon detection pulse generated upon detection of a fluorescent photon that is generated when the fluorescent molecule FM of the cell X2 which is a single target flowing in the microfluidic channel 10 is excited by excitation light of the excitation light source 50 is observed at different times in accordance with a time required to sequentially pass through the photon detection units 21A, 21B, and 21C, as illustrated in FIG. 7. The fluorescent photon detection pulse detected by each of the photon detection units 21A, 21B, and 21C is observed from the fluorescent molecule FM of the same cell X2. This results in observation being performed three times in total by the respective photon detection units 21A, 21B, and 21C, while observation is performed only once when one photon detection unit 21 is provided. Then, results of photon detection operations performed in the time required for the cell X2 flowing in the microfluidic channel 10 to sequentially pass through the photon detection units 21A, 21B, and 21C are summed.

For example, when the fluorescent molecule FM is weak, the number of fluorescent photon detection pulses is small and a sufficient SN (signal to noise) ratio may not be obtained by single observation. In Embodiment 2, by observing fluorescent photon detection pulses by the respective photon detection units 21A, 21B, and 21C, the numbers of fluorescent photon detection pulses obtained by performing observation multiple times are able to be summed and the SN ratio is able to be improved.

[Additional Matter]

According to Embodiment 2, at least two photon detection units 21 (21A, 21B, and 21C) are provided along the microfluidic channel 10.

According to such a configuration, the numbers of fluorescent photon detection pulses obtained by performing observation multiple times are able to be summed, and even when the fluorescent molecule FM is weak and the number of fluorescent photon detection pulses is small, a fluorescent photon generated by a target flowing in the microfluidic channel 10 is able to be detected with the improved SN ratio. As a result, it is possible to increase a measurement time by at least two photon detection units 21 arrayed in a direction in which the target flows and achieve improvement of sensitivity.

Embodiment 3

Embodiment 3 of the invention will be described as follows with reference to FIGS. 8 to 10. Note that, for convenience of description, a member having the same function as that of the member described in Embodiment 1 described above will be given the same reference sign and description thereof will be omitted.

[Configuration of in-Liquid Microparticle Analysis System 103]

Figure 8:
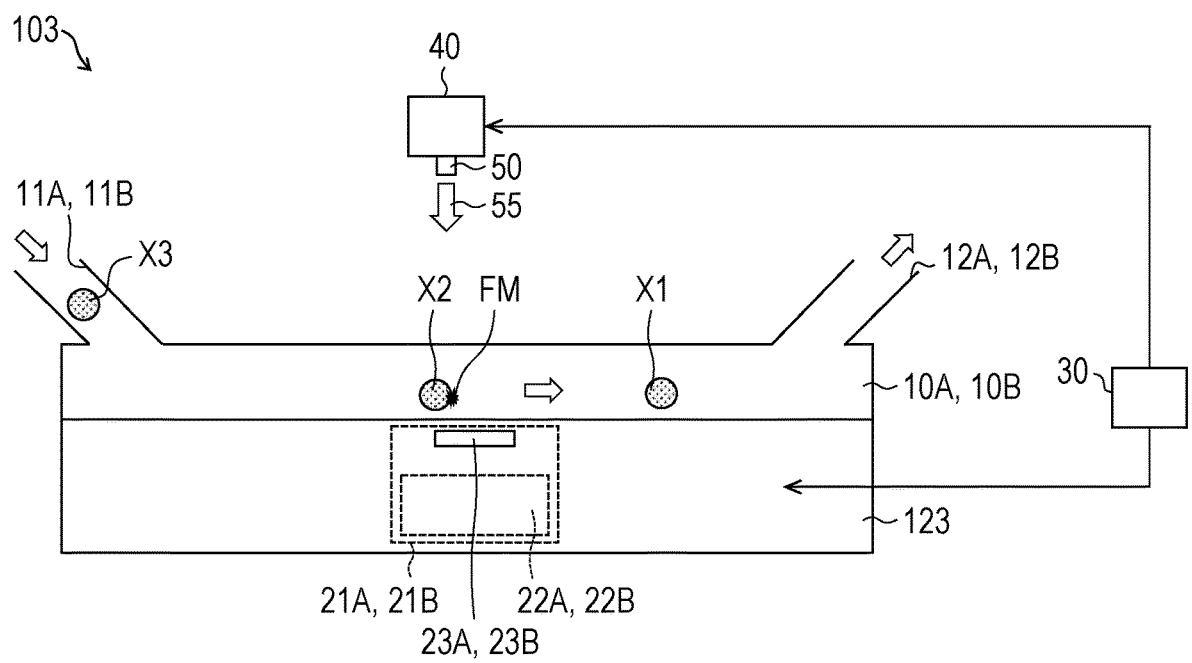
FIG. 8 is a schematic view illustrating a schematic configuration of an in-liquid microparticle analysis system 103 according to Embodiment 3.

FIG. 8 is a schematic view illustrating a schematic configuration of an in-liquid microparticle analysis system 103 according to Embodiment 3 and is a view illustrating the in-liquid microparticle analysis system 103 from a side surface side. FIG. 9 is a plan view of an integrated circuit chip 123 as viewed from a top surface side.

In Embodiment 1 described above, the integrated circuit chip 121 includes one microfluidic channel 10 and one photon detection unit 21 provided below the microfluidic channel 10. Embodiment 1 and Embodiment 3 are different in that the integrated circuit chip 123 includes at least two microfluidic channels 10 (10A and 10B) in Embodiment 3 as illustrated in FIGS. 8 and 9. Note that, though FIGS. 8 and 9 illustrate an example in which the integrated circuit chip 123 includes the two microfluidic channels 10A and 10B provided substantially in parallel to each other, the number of microfluidic channels 10 is only required to be at least two and may be three, four, or the like.

Moreover, the integrated circuit chip 123 has at least one photon detection unit 21A or 21B below each of the microfluidic channels 10A and 10B. In addition, in the in-liquid microparticle analysis system 103, an irradiation range of the excitation light pulse 55 from the excitation light source 50 is adjusted so as to include the light detecting parts of the photodiodes 23A and 23B of all the photon detection units 21A and 21B. Note that, an optical system of the in-liquid microparticle analysis system 103 is constituted by the photon detection units 21A and 21B together.

[In-Liquid Microparticle Analysis Method by in-Liquid Microparticle Analysis System 103]

Microparticles in liquid flowing in the respective microfluidic channels 10A and 10B are separately observed by the photon detection units 21A and 21B, which are below the respective fluidic channels, along a flow of the liquid. FIG. 10 illustrates an example of outputs assumed to be provided from the photon detection units 21A and 21B when a cell X having the fluorescent molecule FM flows in each of the microfluidic channels 10A and 10B. Similarly to FIG. 4 described above, FIG. 10 illustrates graphs with the horizontal axis indicating time in which the numbers of fluorescent photon detection pulses for each of 1000 photon detection operations are plotted.

Figure 9:
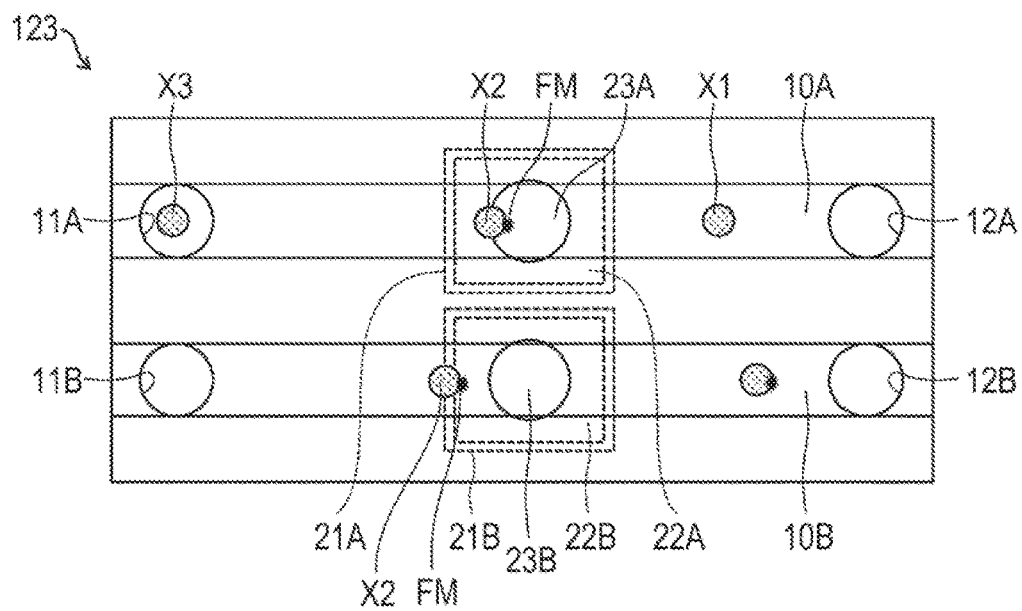
FIG. 9 is a schematic view illustrating a schematic configuration of an integrated circuit chip 123.
Figure 10:
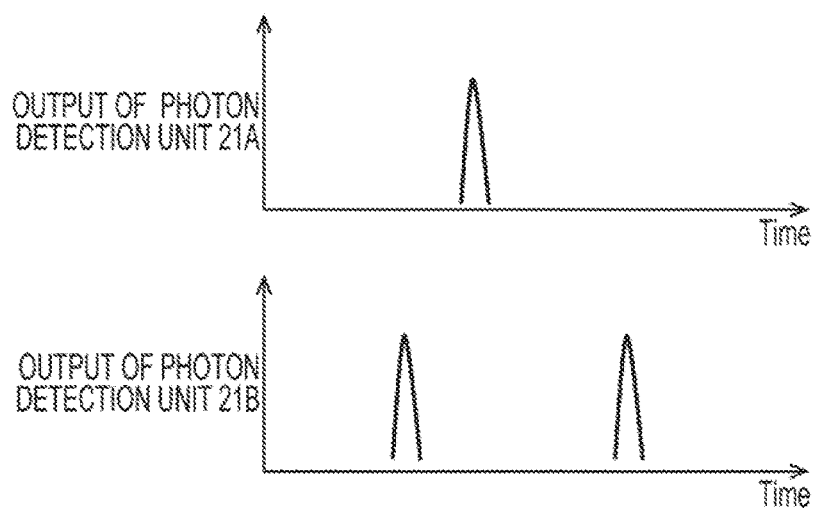
FIG. 10 illustrates graphs with the horizontal axis indicating time in which the numbers of fluorescent photon detection pulses output from photon detection units 21A and 21B are plotted.

As illustrated in FIGS. 9 and 10, in a case where the liquid flowing in the microfluidic channel 10A contains a microparticle such as the cell X having the fluorescent molecule FM, the fluorescent molecule FM is detected by the photon detection unit 21A when the microparticle passes over the photodiode 23A. In a case where the liquid flowing in the microfluidic channel 10B contains a microparticle such as the cell X having the fluorescent molecule FM, the fluorescent molecule FM is detected by the photon detection unit 21B when the microparticle passes over the photodiode 23B.

In this manner, the photon detection units 21A and 21B respectively provided for the plurality of microfluidic channels 10A and 10B operate at the same time in parallel and detect fluorescent photons from targets flowing in the respective fluidic channels. Thereby, the fluorescent photons generated when fluorescent molecules FM of cells X flowing in the respective microfluidic channels 10A and 10B are excited are separately observed by the photon detection units 21A and 21B that are below the respective fluidic channels. As a result, the microparticles in the liquid flowing in the plurality of respective microfluidic channels 10A and 10B are able to be analyzed at the same time in parallel and throughput of the analysis is able to be improved.

[Additional Matter]

According to Embodiment 3, at least two microfluidic channels 10 (10A and 10B) are provided and the photon detection units 21 (21A and 21B) are provided in the respective microfluidic channels 10.

According to such a configuration, fluorescent photons generated by targets flowing in at least two respective microfluidic channels 10A and 10B are able to be detected, and by performing analysis at the same time in parallel in the plurality of fluidic channels, throughput of the analysis is able to be improved. Thus, even intending to measure microparticles in a fluid flowing in a plurality of fluidic channels at the same time in parallel, it is not necessary to perform scanning with laser light at a high speed, array photodetectors, or repeat measurement while stepping a fluid system to change a position, so that further complication or size increase of the device is able to be prevented. Further, when the targets flow in at least two respective microfluidic channels 10, processing for analyzing microparticles in liquid is able to be performed in parallel and an increase in throughput is able to be achieved.

Embodiment 4

Embodiment 4 of the invention will be described as follows with reference to FIGS. 11 to 13. Note that, for convenience of description, a member having the same function as that of the member described in the embodiments described above will be given the same reference sign and description thereof will be omitted.

[Configuration of in-Liquid Microparticle Analysis System 104]

Figure 11:
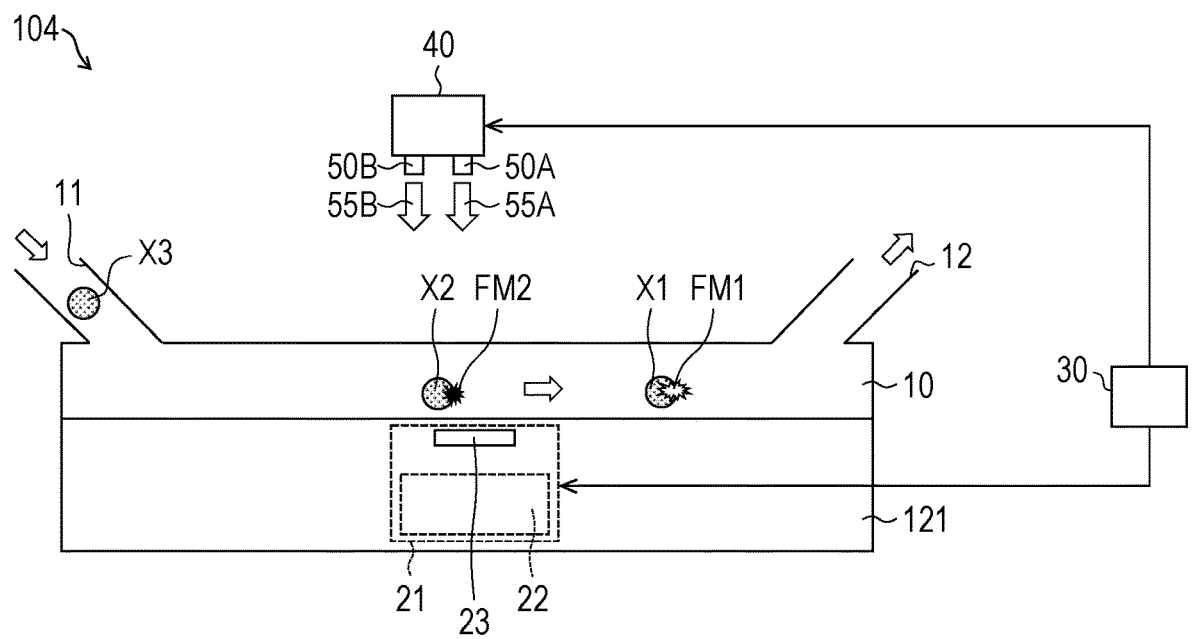
FIG. 11 is a schematic view illustrating a schematic configuration of an in-liquid microparticle analysis system 104 according to Embodiment 4.

FIG. 11 is a schematic view illustrating a schematic configuration of an in-liquid microparticle analysis system 104 according to Embodiment 4 and is a view illustrating the in-liquid microparticle analysis system 104 from a side surface side.

Embodiment 1 described above provides a configuration in which liquid flowing in the microfluidic channel 10 is irradiated with the excitation light pulse 55 from one excitation light source 50. Embodiment 1 and Embodiment 4 are different in that two laser light sources 50A and 50B having different wavelengths are provided as excitation light sources 50 in Embodiment 4 as illustrated in FIG. 11.

Figure 12A:
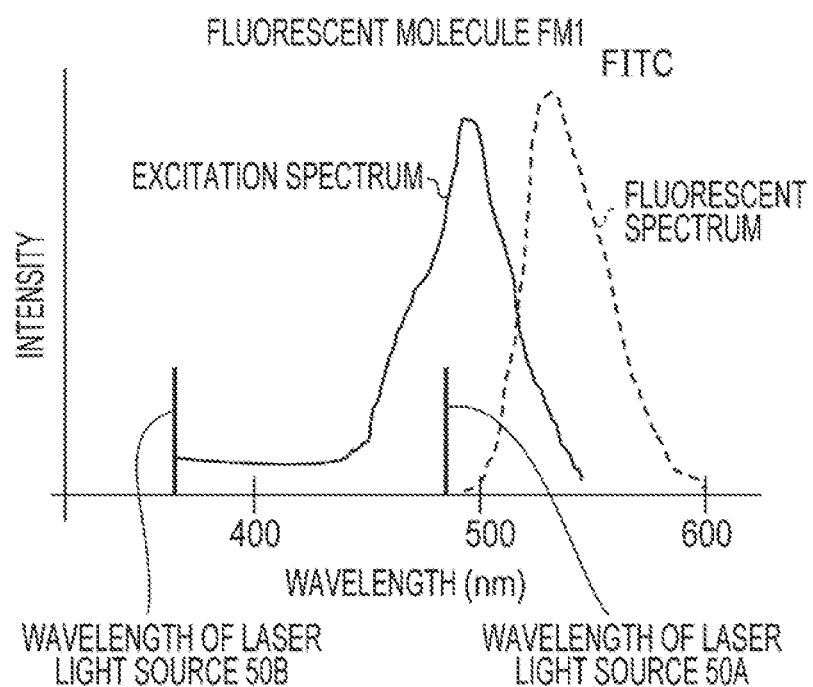
FIGS. 12A and 12B illustrate excitation spectrums and fluorescent spectrums in a fluorescent molecule FM1 and a fluorescent molecule FM2 relative to wavelengths of a laser light source 50A and a laser light source 50B.
Figure 12B:
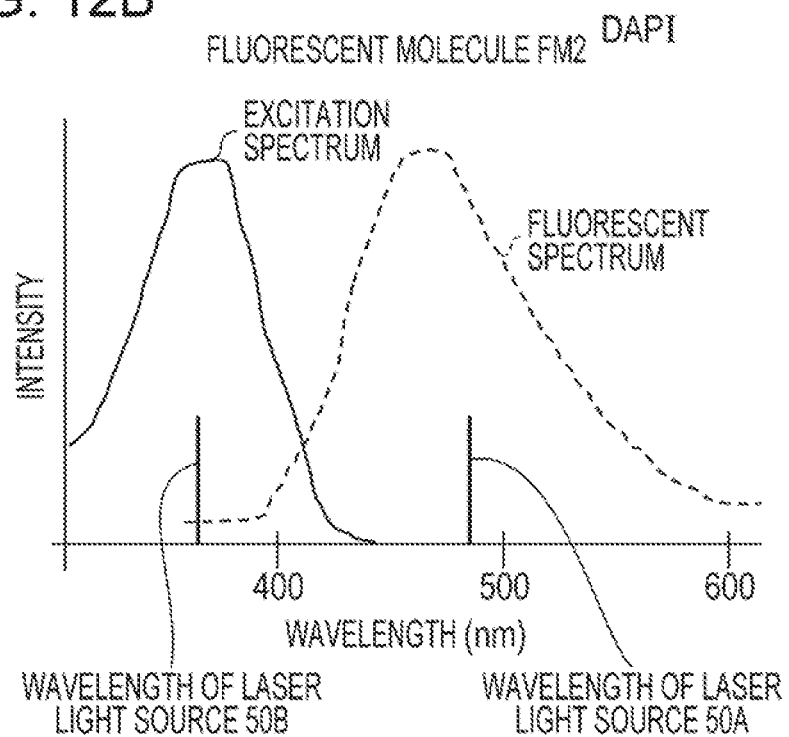

In a case where a microparticle is analyzed by using fluorescence as a marker, a plurality of markers need to be used in some cases to identify different targets. For example, there is a case where FITC is used as a fluorescent molecule FM1 and DAPI is used as a fluorescent molecule FM2. FIG. 12A and FIG. 12B illustrate excitation spectrums and fluorescent spectrums in the fluorescent molecule FM1 (FITC) and the fluorescent molecule FM2 (DAPI) relative to the wavelengths of the laser light source 50A and the laser light source 50B. The wavelength of excitation light of the laser light source 50A is set to 488 nm and the wavelength of excitation light of the laser light source 50B is set to 375 nm. In this configuration, the excitation light of the laser light source 50A excites the fluorescent molecule FM1 but does not excite the fluorescent molecule FM2 as illustrated in FIG. 12A and FIG. 12B. Moreover, the excitation light of the laser light source 50B excites the fluorescent molecule FM2 but does not excite the fluorescent molecule FM1.

[In-Liquid Microparticle Analysis Method by in-Liquid Microparticle Analysis System 104]

FIG. 13 is a timing chart illustrating timing for controlling irradiation operations with the excitation light from the laser light source 50A and the laser light source 50B and the photon detection operation of the photon detection unit 21.

FIG. 13(a) is a timing chart illustrating timing when control is performed so as to alternately drive the laser light source 50A and the laser light source 50B. At the control timing illustrated in FIG. 13(a), a fluorescent photon by the fluorescent molecule FM1 is detected by the light detecting operation (periods of T1, T3, T5, and T7 in FIG. 13) of the photon detection unit 21 after an excitation source of the laser light source 50A is caused to emit light. Further, a fluorescent photon by the fluorescent molecule FM2 is detected by the light detecting operation (periods of T2, T4, and T6 in FIG. 13) of the photon detection unit 21 after the laser light source 50B is caused to emit light.

Moreover, the irradiation operation of performing irradiation with excitation light may be controlled by a driving pattern of the laser light sources 50A and 50B in which the laser light source 50A is driven multiple times and the laser light source 50B is then driven multiple times, as illustrated in FIG. 13(b). At the control timing illustrated in FIG. 13(b), the fluorescent photon by the fluorescent molecule FM1 is detected by the light detecting operation (periods of T1, T2, T3, and T7 in FIG. 13) of the photon detection unit 21 after the excitation source of the laser light source 50A is caused to emit light. Further, the fluorescent photon by the fluorescent molecule FM2 is detected by the light detecting operation (periods of T4, T5, and T6 in FIG. 13) of the photon detection unit 21 after the laser light source 50B is caused to emit light.

In this manner, in the in-liquid microparticle analysis system 104, detection results of photon detection operations of detecting the fluorescent photon generated after the excitation light emitted by the laser light sources 50A and 50B which have a plurality of wavelengths is switched off are summed for each of the wavelengths of the laser light sources 50A and 50B, so that a relationship between an excitation wavelength and fluorescent intensity is estimated or a type of a fluorescent molecule is further estimated.

According to such configurations, the fluorescent photon generated by the fluorescent molecule FM1 and the fluorescent photon generated by the fluorescent molecule FM2 do not need to be separated by an optical filter, thus making it possible to identify different targets by using a plurality of fluorescent markers without increasing a size of the optical system.

[Additional Matter]

According to Embodiment 4, the excitation light source 50 includes the plurality of laser light sources 50A and 50B wavelengths of which are different from each other, and performs pulse light emission with a wavelength changed by switching the laser light sources 50A and 50B performing the irradiation operation.

According to such a configuration, in order to identify different targets, a plurality of fluorescent markers having different excitation spectrums are able to be used and the excitation light is able to be emitted from the laser light sources 50A and 50B having different wavelengths with irradiation timing shifted. Thus, it is possible to detect a plurality of fluorescent photons, which are generated by targets and have different fluorescent spectrums, without size increase or complication of the optical system.

Embodiment 5

Embodiment 5 of the invention will be described as follows with reference to FIGS. 14 to 17. Note that, for convenience of description, a member having the same function as that of the member described in the embodiments described above will be given the same reference sign and description thereof will be omitted.

[Configuration of in-Liquid Microparticle Analysis System 105]

Figure 14:
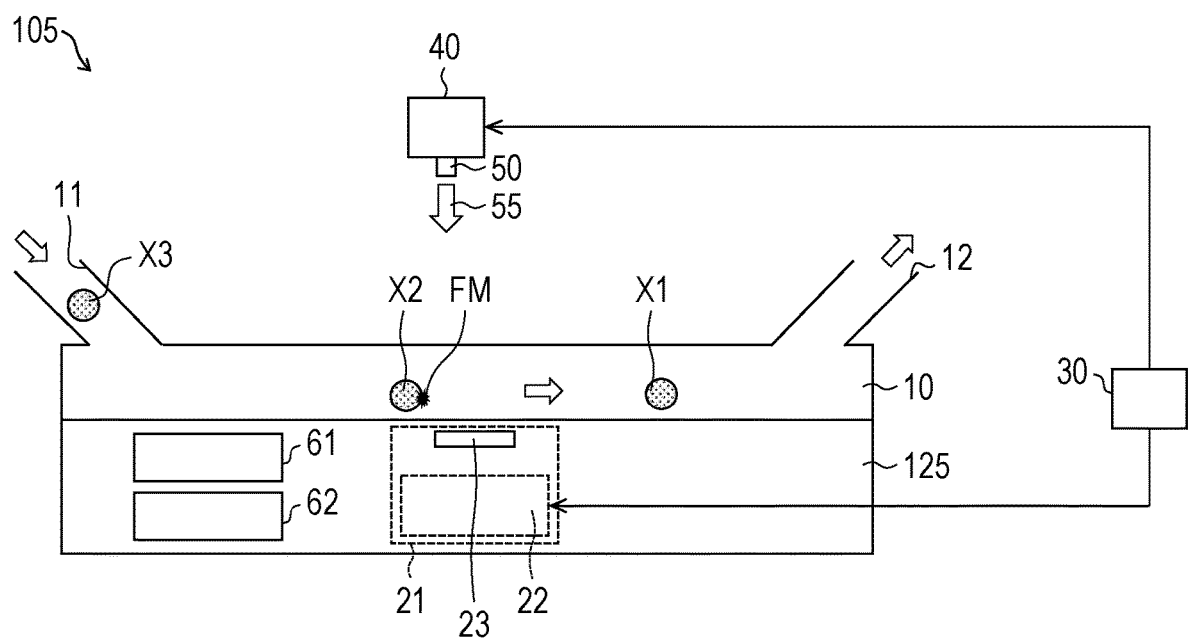
FIG. 14 is a schematic view illustrating a schematic configuration of an in-liquid microparticle analysis system 105 according to Embodiment 5.
Figure 15:
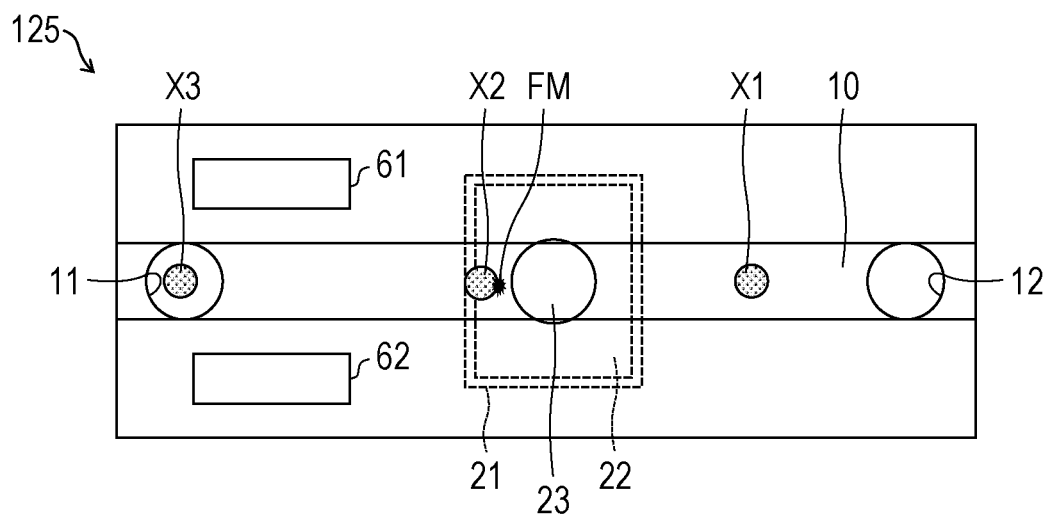
FIG. 15 is a schematic view illustrating a schematic configuration of an integrated circuit chip 125.

FIG. 14 is a schematic view illustrating a schematic configuration of an in-liquid microparticle analysis system 105 according to Embodiment 5 and is a view illustrating the in-liquid microparticle analysis system 105 from a side surface side. FIG. 15 is a plan view of an integrated circuit chip 125 as viewed from a top surface side.

Embodiment 1 described above and Embodiment 5 are different in that a time to digital converter (TDC) circuit 61 and a fluorescent lifetime calculation unit 62 are incorporated in the integrated circuit chip 125 in Embodiment 5 as illustrated in FIGS. 14 and 15. Upon reception of a fluorescent photon detection pulse, which is output when a fluorescent photon is detected, by the light detecting circuit 22, the TDC circuit 61 converts a time, which is required from when a driving pulse of the excitation light source 50 rises until the fluorescent photon detection pulse is output, into a digital value and outputs the resultant. Note that, an optical system of the in-liquid microparticle analysis system 105 is constituted by the photon detection unit 21, the TDC circuit 61, and the fluorescent lifetime calculation unit 62 together.

[In-Liquid Microparticle Analysis Method by in-Liquid Microparticle Analysis System 105]

Figure 16:
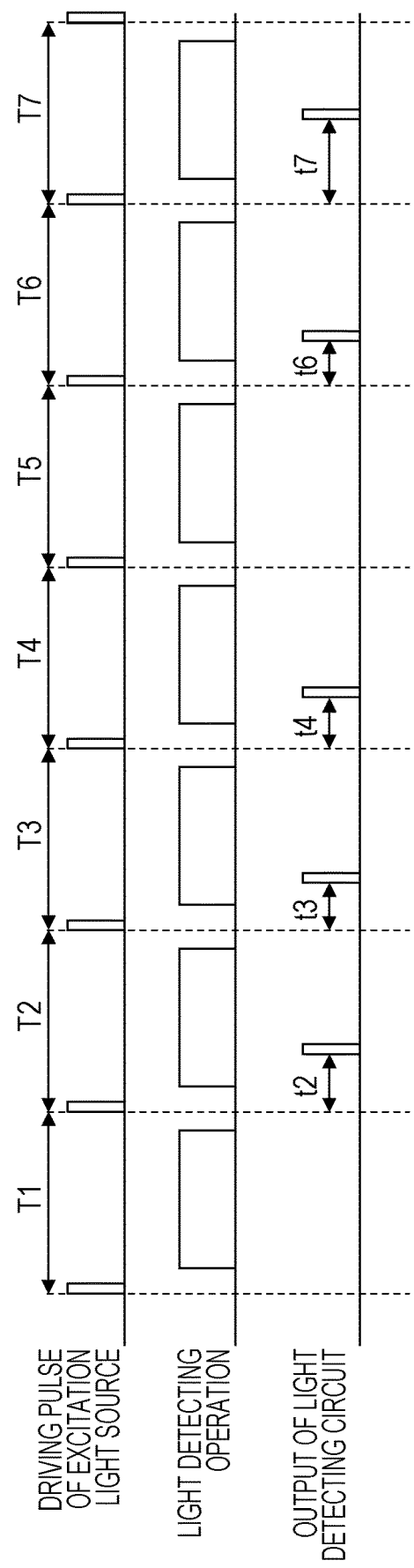
FIG. 16 is a timing chart illustrating timing of the irradiation operation of the excitation light source 50, the photon detection operation of the photon detection unit 21, and an output of a fluorescent photon detection pulse of a light detecting circuit 22.

FIG. 16 is a timing chart exemplifying timing of the irradiation operation (driving pulse) with the excitation light from the excitation light source 50, the photon detection operation of the photon detection unit 21, and an output of the fluorescent photon detection pulse of the light detecting circuit 22.

An operation of the TDC circuit 61 will be described with reference to FIG. 16. In this example, the light detecting circuit 22 outputs the fluorescent photon detection pulse at photon detection operation cycles T2, T3, T4, T6, and T7. For example, in T2, upon reception of the fluorescent photon detection pulse, the TDC circuit 61 outputs, as a digital value, a time t2 from timing when the driving pulse of the excitation light source 50 rises to timing when the fluorescent photon detection pulse is generated. In this manner, for each of fluorescent photon detection pulses output by the light detecting circuit 22, a delay time of the cycle, in which the pulse is generated, from the timing when the driving pulse of the excitation light source 50 rises is measured.

Figure 17:
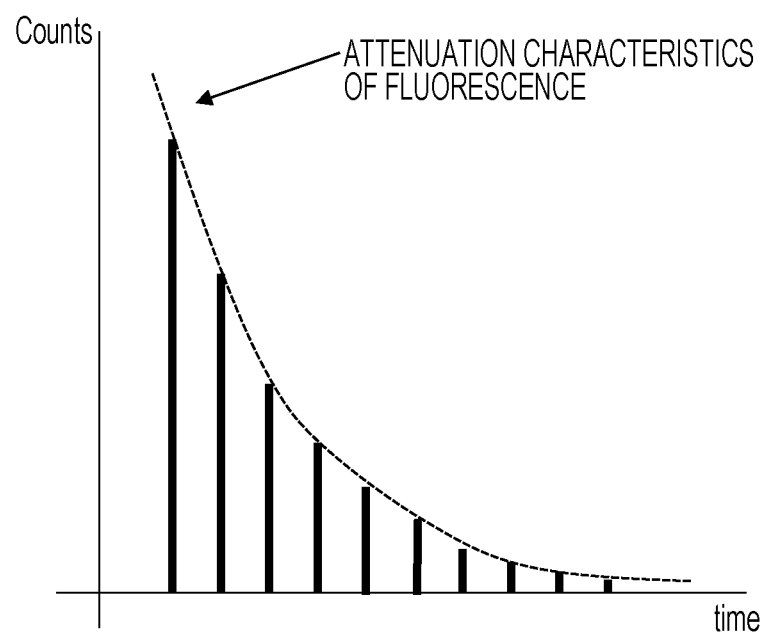
FIG. 17 is a histogram illustrating the number of fluorescent photon detection pulses generated.

The fluorescent lifetime calculation unit 62 acquires information (result of measuring a time from the timing when the driving pulse of the excitation light source 50 rises to the timing when the fluorescent photon detection pulse is generated) which is output from the TDC circuit 61 and relates to a generation time of each of the fluorescent photon detection pulses. Then, the information related to the generation time of each of the fluorescent photon detection pulses is divided into some bins (small sections) and a histogram illustrating distribution information of the number of pulses generated in each of the bins is created as illustrated in FIG. 17. The fluorescent lifetime calculation unit 62 estimates a fluorescent lifetime τ from attenuation characteristics of the histogram.

For example, in a case where a plurality of fluorescent markers (fluorescent molecules FM) whose fluorescent lifetimes are known in advance are used to identify a given target, a fluorescent photon is able to be detected on the basis of the fluorescent lifetime τ obtained cooperatively by the TDC circuit 61 and the fluorescent lifetime calculation unit 62. In a case where the fluorescent molecule FM1 having the fluorescent lifetime of 3 nsec and the fluorescent molecule FM2 having the fluorescent lifetime of 15 nsec are used, from which of the fluorescent molecules the fluorescent photon is obtained is able to be determined on the basis of the fluorescent lifetime t calculated on the basis of the fluorescent photon detection pulse output by the light detecting circuit 22.

In this manner, in the in-liquid microparticle analysis system 105, the photon detection operation of detecting the fluorescent photon generated after the excitation light emitted by the excitation light source 50 is switched off is repeated, and the fluorescent lifetime of the fluorescent molecule is estimated from distribution information of photon detection timing, which is obtained in each photon detection operation, or a type of the fluorescent molecule is further estimated. This makes it possible to detect the fluorescent molecule on the basis of the fluorescent lifetime τ calculated on the basis of the fluorescent photon detection pulse output by the light detecting circuit 22, so that the fluorescent photon generated by the excitation light of the excitation light source 50 and the fluorescent photon generated by the fluorescent molecule FM excited by the excitation light of the excitation light source 50 do not need to be separated by an optical filter, thus making it possible to achieve a size reduction in the optical system. Moreover, even when a plurality of fluorescent markers are used to identify different targets, respective fluorescent photons do not need to be separated by an optical filter and a plurality of fluorescent photons generated by targets are able to be detected on the basis of the fluorescent lifetime τ without size increase or complication of the optical system.

[Additional Matter]

According to Embodiment 5, the TDC circuit that measures, on the basis of timing of the irradiation operation of the excitation light source 50, timing when the photon detection unit 21 detects a photon, and the fluorescent lifetime calculation unit 62 that calculates a fluorescent lifetime of the photon detected by the photon detection unit 21, in accordance with a measurement result of the TDC circuit are provided.

According to such a configuration, since a fluorescent photon generated by the fluorescent molecule FM used to identify a given target is able to be detected on the basis of the fluorescent lifetime τ, an optical filter does not need to be used and a size reduction is able to be achieved in the optical system.

CONCLUSION

An in-liquid microparticle analysis system 101 according to an aspect 1 of the invention includes: an integrated circuit chip 121 in which a photon detection unit 21 including a photodiode 23 is incorporated; a microfluidic channel 10 formed on a front surface side of the integrated circuit chip 121; an excitation light source 50 that irradiates the microfluidic channel 10 with excitation light; and a control circuit 30 that synchronously controls a photon detection operation of the photon detection unit 21 and a irradiation operation of the excitation light source 50, in which the control circuit 30 controls the photon detection operation of the photon detection unit 21 on the basis of timing of the irradiation operation of the excitation light source 50, and after the excitation light emitted to the microfluidic channel 10 is switched off, the photon detection unit 21 detects a fluorescent photon generated by a target flowing in the microfluidic channel 10.

According to the aforementioned configuration, the excitation light from the excitation light source 50 and the fluorescent photon generated by the target excited by the excitation light do not need to be separated by an optical filter, thus making it possible to achieve a size reduction in the optical system.

The in-liquid microparticle analysis system 102 according to an aspect 2 of the invention may be configured to include at least two photon detection units 21 along the microfluidic channel 10, each of the at least two photon detection units 21 including the photodiode 23, in the aspect 1.

According to the aforementioned configuration, it is possible to increase the number of times of detection and a detection time by at least two photon detection units 21 arrayed in a direction in which the target flows and achieve improvement of sensitivity.

The in-liquid microparticle analysis system 103 according to an aspect 3 of the invention may be configured to include at least two microfluidic channels 10, each of the at least two microfluidic channels 10 being formed on the front surface side of the integrated circuit chip 121, and configured so that each of the microfluidic channels 10 includes the photon detection unit 21, in the aspect 1 or 2.

According to the aforementioned configuration, analysis is able to be performed at the same time in parallel in the plurality of fluidic channels and throughput of the analysis is able to be improved.

The in-liquid microparticle analysis system 104 according to an aspect 4 of the invention may be configured so that the excitation light source 50 includes a plurality of laser light sources 50A and 50B wavelengths of which are different from each other, and pulse light emission is performed with a wavelength changed by switching the laser light sources 50A and 50B performing the irradiation operation, in any one of the aspects 1 to 3.

According to the aforementioned configuration, in order to identify different targets, by using a plurality of fluorescent markers having different excitation spectrums, a plurality of fluorescent photons which are generated by the targets and have different fluorescent spectrums are able to be detected.

The in-liquid microparticle analysis system according to an aspect 5 of the invention may be configured to include: a TDC circuit that measures, on the basis of the timing of the irradiation operation of the excitation light source, timing when the photon detection unit detects the photon; and a fluorescent lifetime calculation unit that calculates, in accordance with a measurement result of the TDC circuit, a fluorescent lifetime of the photon detected by the photon detection unit in any one of the aspects 1 to 4.

According to the aforementioned configuration, since the fluorescent photon generated by the fluorescent molecule FM used to identify a given target is able to be detected on the basis of the fluorescent lifetime τ, an optical filter does not need to be used and a size reduction is able to be achieved in the optical system.

The invention is not limited to each of the embodiments described above, and may be modified in various manners within the scope indicated in the claims and an embodiment achieved by appropriately combining technical means disclosed in different embodiments is also encompassed in the technical scope of the invention. Further, by combining the technical means disclosed in each of the embodiments, a new technical feature may be formed.

For example, a configuration in which an in-liquid microparticle analysis system has at least two microfluidic channels 10 and each of the microfluidic channels 10 is provided with at least two photon detection units 21 along the fluidic channel may be provided. Moreover, a configuration in which an in-liquid microparticle analysis system includes at least two microfluidic channels 10 and a plurality of excitation light sources 50 wavelengths of which are different from each other may be provided. Moreover, a configuration in which an in-liquid microparticle analysis system includes a plurality of microfluidic channels 10, a plurality of photon detection units 21, and a plurality of excitation light sources 50 wavelengths of which are different from each other, and includes the TDC circuit 61 and the fluorescent lifetime calculation unit 62 may be provided.

REFERENCE SIGNS LIST 10, 10A, 10B microfluidic channel
11 inlet
12 outlet
21, 21A, 21B, 21C photon detection unit
30 light detecting circuit
23, 23A, 23B, 23C photodiode
30 control circuit
40 light source driving circuit
50 excitation light source
50A, 50B laser light source
61 TDC circuit
62 fluorescent lifetime calculation unit
101, 102, 103, 104, 105 in-liquid microparticle analysis system
121, 122, 123, 125 integrated circuit chip

The invention claimed is:
1. An in-liquid microparticle analysis system comprising:
an integrated circuit chip in which a photon detection unit including a photodiode is incorporated;
a microfluidic channel formed on a front surface side of the integrated circuit chip;
an excitation light source that irradiates the microfluidic channel with excitation light;
a control circuit that synchronously controls a photon detection operation of the photon detection unit and an irradiation operation of the excitation light source, wherein:
the excitation light comprises beams having a plurality of wavelengths, and the excitation light source emits, at different timings, the beams of excitation light having the plurality of wavelengths,
the control circuit controls the photon detection operation of the photon detection unit on a basis of timing of the irradiation operation of the excitation light source,
after each of the beams of the excitation light emitted to the microfluidic channel is switched off, the photon detection unit detects a fluorescent photon gen- erated by a target flowing in the microfluidic channel and generates a detection pulse, and for each of the wavelengths of the beams of the excitation light, the in-liquid microparticle analysis system sums up a number of detection pulses generated as a result of photon detection operations for detecting fluorescent photons generated after the beams of excitation light having the plurality of wavelengths are switched off, and estimates a relationship between an excitation wavelength and fluorescent intensity or further estimates a type of a fluorescent molecule;

a time to digital converter (TDC) circuit that measures, on a basis of the timing of the irradiation operation of the excitation light source, a time duration from a time when a driving pulse of the excitation light source rises to a time when the detection pulse is generated; and a fluorescent lifetime calculation unit that calculates a fluorescent lifetime of the photon detected by the photon detection unit, from attenuation characteristics of a histogram indicative of distribution information of the number of pulses generated in each of sections into which information related to a generation time of each detection pulse is divided, the histogram being created in accordance with a measurement result of the TDC circuit.

2. The in-liquid microparticle analysis system according to claim 1, further comprising at least two photon detection units along the microfluidic channel, each of the at least two photon detection units including the photodiode.

3. The in-liquid microparticle analysis system according to claim 1, wherein the microfluidic channel includes at least two microfluidic channels, each of the at least two microfluidic channels being formed on the front surface side of the integrated circuit chip, wherein each of the microfluidic channels includes the photon detection unit.

4. The in-liquid microparticle analysis system according to claim 1, wherein the excitation light source includes a plurality of laser light sources wavelengths of which are different from each other, and pulse light emission is performed with a wavelength changed by switching the laser light sources performing the irradiation operation.

5. An in-liquid microparticle analysis method for analyzing a microparticle in liquid by using an in-liquid microparticle analysis system, the in-liquid microparticle analysis system comprising:

an integrated circuit chip in which a photon detection unit including a photodiode is incorporated;

a microfluidic channel formed on a front surface side of the integrated circuit chip;

an excitation light source that irradiates the microfluidic channel with excitation light;

a control circuit that synchronously controls a photon detection operation of the photon detection unit and an irradiation operation of the excitation light source, wherein:

the excitation light comprises beams having a plurality of wavelengths, and the excitation light source emits, at different timings, the beams of excitation light having the plurality of wavelengths, the control circuit controls the photon detection operation of the photon detection unit on a basis of timing of the irradiation operation of the excitation light source, after each of the beams of the excitation light emitted to the microfluidic channel is switched off, the photon detection unit detects a fluorescent photon generated by a target flowing in the microfluidic channel and generates a detection pulse, and for each of the wavelengths of the beams of the excitation light, the in-liquid microparticle analysis system sums up a number of detection pulses generated as a result of photon detection operations for detecting fluorescent photons generated after the beams of excitation light having the plurality of wavelengths are switched off, and estimates a relationship between an excitation wavelength and fluorescent intensity or further estimates a type of a fluorescent molecule;

a time to digital converter (TDC) circuit that measures, on a basis of the timing of the irradiation operation of the excitation light source, a time duration from a time when a driving pulse of the excitation light source rises to a time when the detection pulse is generated; and a fluorescent lifetime calculation unit that calculates a fluorescent lifetime of the photon detected by the photon detection unit, from attenuation characteristics of a histogram indicative of distribution information of the number of pulses generated in each of sections into which information related to a generation time of each detection pulse is divided, the histogram being created in accordance with a measurement result of the TDC circuit, wherein:

a photon detection operation is repeated a plurality of times, the photon detection operation being an operation of detecting a fluorescent photon, the fluorescent photon being generated after the excitation light is switched off, the excitation light being emitted by the excitation light source, and a fluorescent lifetime of a fluorescent molecule is estimated from distribution information of photon detection timing obtained in each photon detection operation or a type of the fluorescent molecule is further estimated.

6. An in-liquid microparticle analysis system comprising:

an integrated circuit chip in which a photon detection unit including a photodiode is incorporated;

a microfluidic channel formed on a front surface side of the integrated circuit chip;

an excitation light source that irradiates the microfluidic channel with excitation light; and a control circuit that synchronously controls a photon detection operation of the photon detection unit and an irradiation operation of the excitation light source, wherein:

the control circuit controls the photon detection operation of the photon detection unit on a basis of timing of the irradiation operation of the excitation light source, after the excitation light emitted to the microfluidic channel is switched off, the photon detection unit detects a fluorescent photon generated by a target flowing in the microfluidic channel and generates a detection pulse, and the in-liquid microparticle analysis system further comprises:

a time to digital converter (TDC) circuit that measures, on a basis of the timing of the irradiation operation of the excitation light source, a time duration from a time when a driving pulse of the excitation light source rises to a time when the detection pulse is generated; and a fluorescent lifetime calculation unit that calculates a fluorescent lifetime of the photon detected by the photon detection unit, from attenuation characteristics of a histogram indicative of distribution information of the number of pulses generated in each of sections into which information related to a generation time of each detection pulse is divided, the histogram being created in accordance with a measurement result of the TDC circuit.

\* \* \* \* \*